(12) United States Patent
Ayers

(10) Patent No.: US 8,259,483 B1
(45) Date of Patent: Sep. 4, 2012

(54) NON-VOLATILE MEMORY MODULE

(76) Inventor: Mark Ayers, Costa Mesa, CA (US)

( * ) Notice: Subject to any disclaimer, the term of this patent is extended or adjusted under 35 U.S.C. 154(b) by 123 days.

(21) Appl. No.: 12/655,494

(22) Filed: Dec. 30, 2009

(51) Int. Cl.
G11C 16/04 (2006.01)
G11C 16/06 (2006.01)

(52) U.S. Cl. .................. 365/51; 365/185.13; 365/185.11

(58) Field of Classification Search ........................ None
See application file for complete search history.

(56) References Cited

U.S. PATENT DOCUMENTS

| | | | |
|---|---|---|---|
| 5,093,985 A * | 3/1992 | Houldsworth et al. ......... | 29/830 |
| 6,172,895 B1 | 1/2001 | Brown et al. | |
| 6,381,164 B1 | 4/2002 | Fan et al. | |
| 6,545,895 B1 * | 4/2003 | Li et al. ........................... | 365/52 |
| 6,597,062 B1 | 7/2003 | Li et al. | |
| 6,661,690 B2 | 12/2003 | Moriarty et al. | |
| 2003/0126378 A1 * | 7/2003 | Nikutta ......................... | 711/149 |
| 2006/0184736 A1 * | 8/2006 | Benhase et al. ................ | 711/118 |
| 2006/0255459 A1 * | 11/2006 | Muff et al. ..................... | 257/738 |
| 2007/0109271 A1 * | 5/2007 | Wang ............................. | 345/173 |

* cited by examiner

Primary Examiner — Hoai V Ho
Assistant Examiner — James G Norman
(74) Attorney, Agent, or Firm — Dennis W. Beech

(57) ABSTRACT

The present invention may be used in systems for non-volatile memory storage of electronic data. A first substrate member may have a first and second surface with a first and second substrate connector spaced apart and attached to the first surface and a first and second spacer element spaced apart and attached to said second surface. A NAND flash controller device may be mounted on the first surface and connected to the substrate connectors and spacer elements. Multiple NAND memory devices may be mounted on the second surface and be connected to the NAND flash controller device. A second substrate member may have a first and second surface with multiple NAND flash memory devices mounted on at least one of the surfaces. The second substrate member may be attached to the spacer elements on the first surface and said multiple NAND flash memory devices may be connected to the NAND flash controller device.

16 Claims, 10 Drawing Sheets

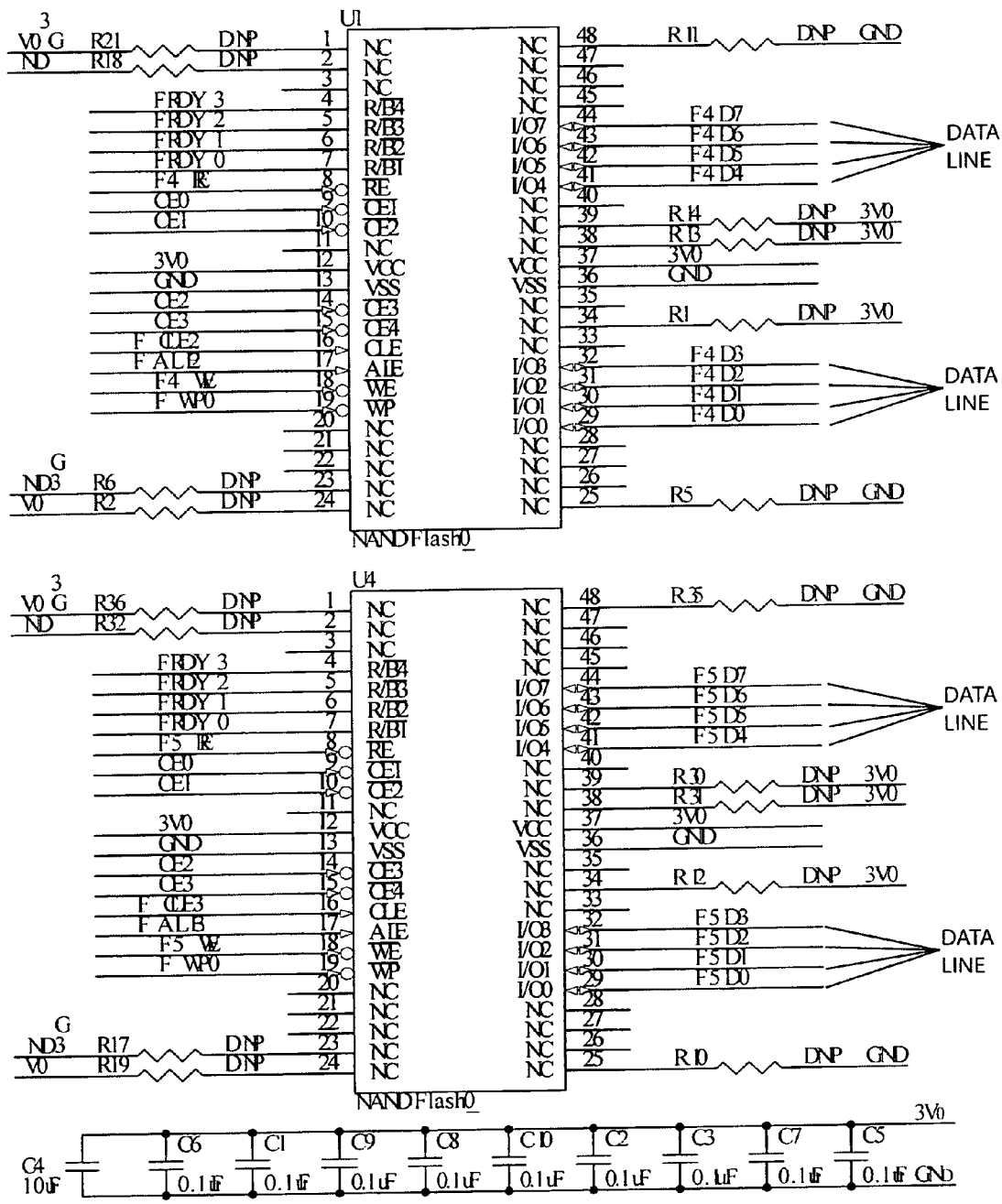

FIG 8b
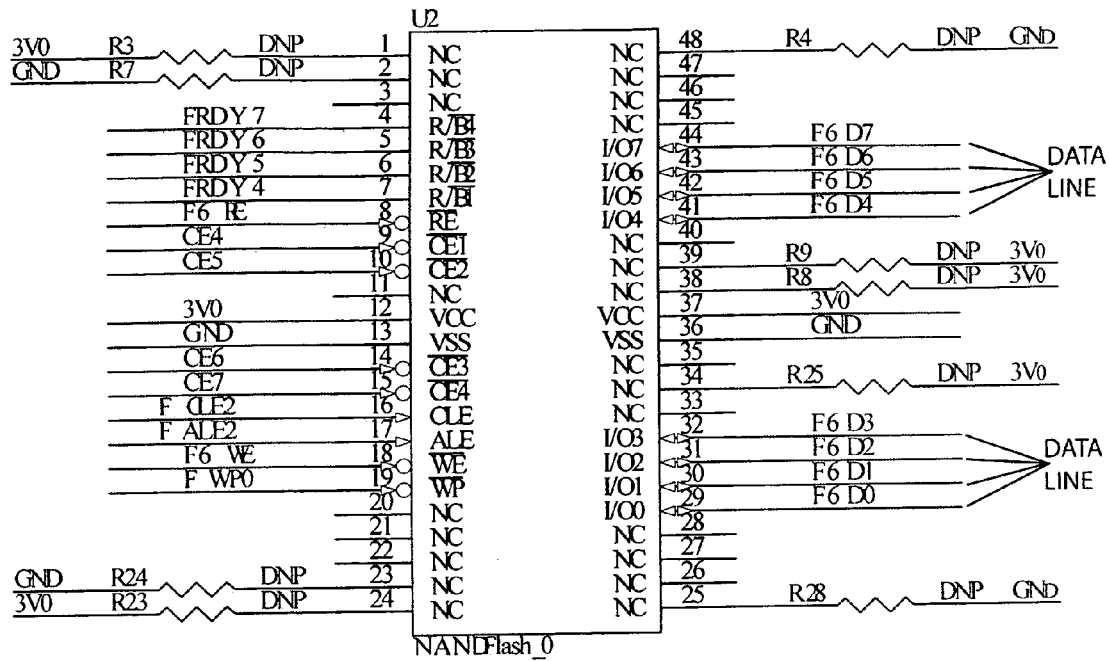
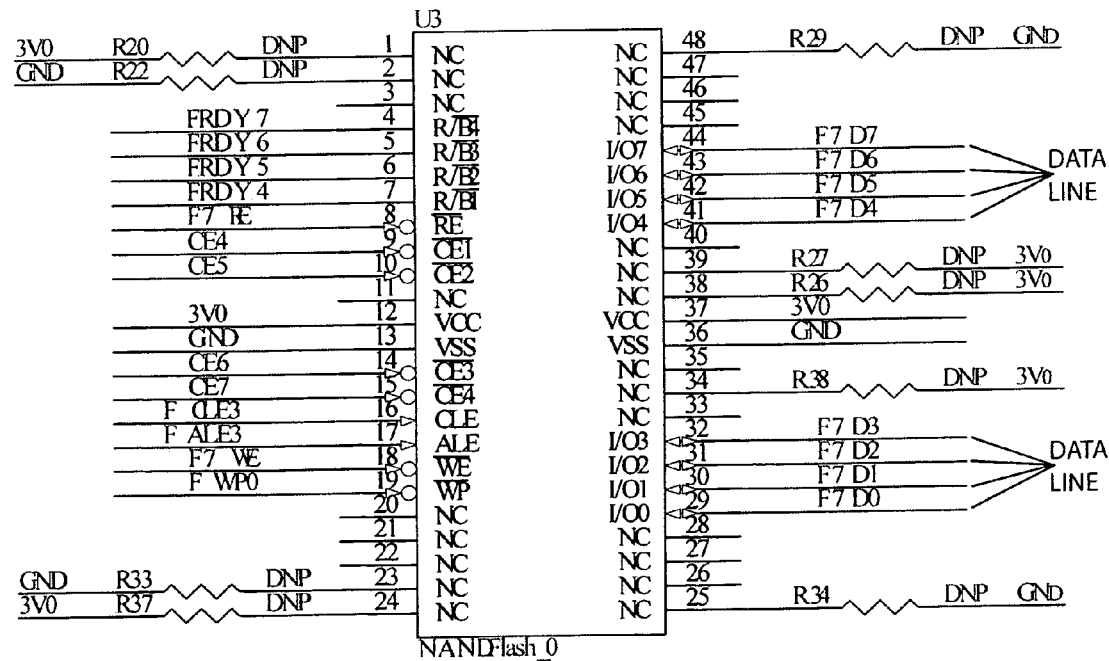

FIG. 9

Figure 9 Assembly Process

Panelized Flash layer 1 side 1 screen print

Panelized Flash layer 1 side 1 component placement

Panelized Flash layer 1 side 1 reflow

Panelized Flash layer 1 side 2 screen print

Panelized Flash layer 1 side 2 component placement

Panelized Flash layer 1 side 2 component placement

Panelized Flash layer 1 depanelization/separation

Depanelized Flash layer 1 load into component placement trays

Panelized Flash layer 2 side 1 screen print

Panelized Flash layer 2 side 1 component placement

Panelized Flash layer 2 side 1 reflow

Panelized Flash layer 2 side 2 screen print

Panelized Flash layer 2 side 2 component placement

Panelized Flash layer 2 side 2 placement of Flash layer 1 as component

Panelized Flash layer 2 side 2 reflow

Panelized Flash layer 2 depanelization/separation

Depanelized Flash layer 2 with Flash layer 1 attached load into component placement trays Panelized Flash/Controller layer 3 side 1 screen print Panelized Flash/Controller layer 3 side 1 component placement Panelized Flash /Controller layer 3 side 1 reflow Panelized Flash /Controller Layer 3 side 2 screen print Panelized Flash /Controller layer 3 side 2 component placements Panelized Flash /Controller layer 3 side 2 of placement of attached Flash layer 2 and 1 as component Panelized Flash layer 3 side 2 reflow Panelized Flash layer 3 depanelization/separation

NON-VOLATILE MEMORY MODULE

BACKGROUND OF THE INVENTION

The invention relates to memory devices that allow non-volatile storage of data in a relatively compact module using solid state electronic devices that may be used in place of disk drive devices, for example, in computing systems, data processing and network. The new memory module may use NAND flash memory devices attached to printed circuit boards (PCB) using surface mount technology that may be connected in parallel to a NAND flash controller device attached adjacent to the input/output of the memory module. The memory module may be assembled as multiple PCB's stacked adjacent, spaced apart and interconnected with PCB spacers intermediate adjacent PCB.

NAND flash memory devices have found acceptance for use in data storage applications requiring relatively small capacity, standard from factor PCB or substrate elements that may allow use of one to four memory devices for storage capacity of up to 64 gigabytes. The NAND flash memory devices may be attached to a PCB and have data input/output (I/O) communicated through a NAND flash controller for distribution through parallel I/O data lines to selected memory devices. In use where larger data storage using NAND flash memory devices may be desired, multiple PCB memory units may be used with cables, mid-planes, connectors and adapters to interconnect with the data I/O source. This type of structural architecture may lead to bulky, complex, reduced speed/performance of a flash memory system. While a single PCB flash memory unit may have up to 64 gigabytes of memory capacity as a non-volatile standard form factor devices, there is a need for larger capacity, non-volatile memory storage module.

There may be high I/O, high density, low cost electronic modules that use high density memory devices such as RAMBUS devices with a high speed serial bus to obtain high data throughput using multiple RAMBUS devices. However, this type of architecture requires use of impedance controlled buses with terminating circuitry to match the bus transmission characteristics. While such impedance control can be implemented on a RAMBUS PCB or on a motherboard/host PCB, this is an added complexity, performance element for use of high speed serial buses that is not present with the use of parallel connected memory storage devices.

The memory devices in a RAMBUS architecture are serially connected to a bus that may allow close location of multiple devices to a host chip or device. However, as mentioned above the use of a high speed data bus throughout the RAMBUS module creates other design issues that must be taken into account. The use of a parallel data bus architecture, such as, NAND flash memory device used with a NAND control, may more easily allow assembly of a compact memory module that can be located close to a host chip of a processor and may provide throughput equivalent to RAMBUS architecture and disk drive memory devices. RAMBUS memory devices are generally volatile memory storage devices.

SUMMARY OF THE INVENTION

The present invention is directed to memory devices for non-volatile memory storage of electronic data. A first substrate member may have a first and second surface with a first and second substrate connector spaced apart and attached to the first surface and a first and second spacer element spaced apart and attached to the second surface. A NAND flash controller device may be mounted on the first surface and connected to the substrate connectors and spacer elements. Multiple NAND memory devices may be mounted on the second surface and be connected to the NAND flash controller device. A second substrate member may have a first and second surface with multiple NAND flash memory devices mounted on at least one of the surfaces. The second substrate member may be attached to the spacer elements on the first surface and the multiple NAND flash memory devices may be connected to the NAND flash controller device.

These and other features, aspects and advantages of the present invention will become better understood with reference to the following drawings, description and claims.

BRIEF DESCRIPTION OF THE DRAWINGS

FIG. 8 illustrates a schematic of one side of a memory board device layout according to an embodiment of the invention;

FIG. 9 illustrates a functional diagram of a module fabrication method according to an embodiment of the invention.

DETAILED DESCRIPTION

The following detailed description represents the best currently contemplated modes for carrying out the invention. The description is not to be taken in a limiting sense, but is made merely for the purpose of illustrating the general principles of the invention.

Figure 1:
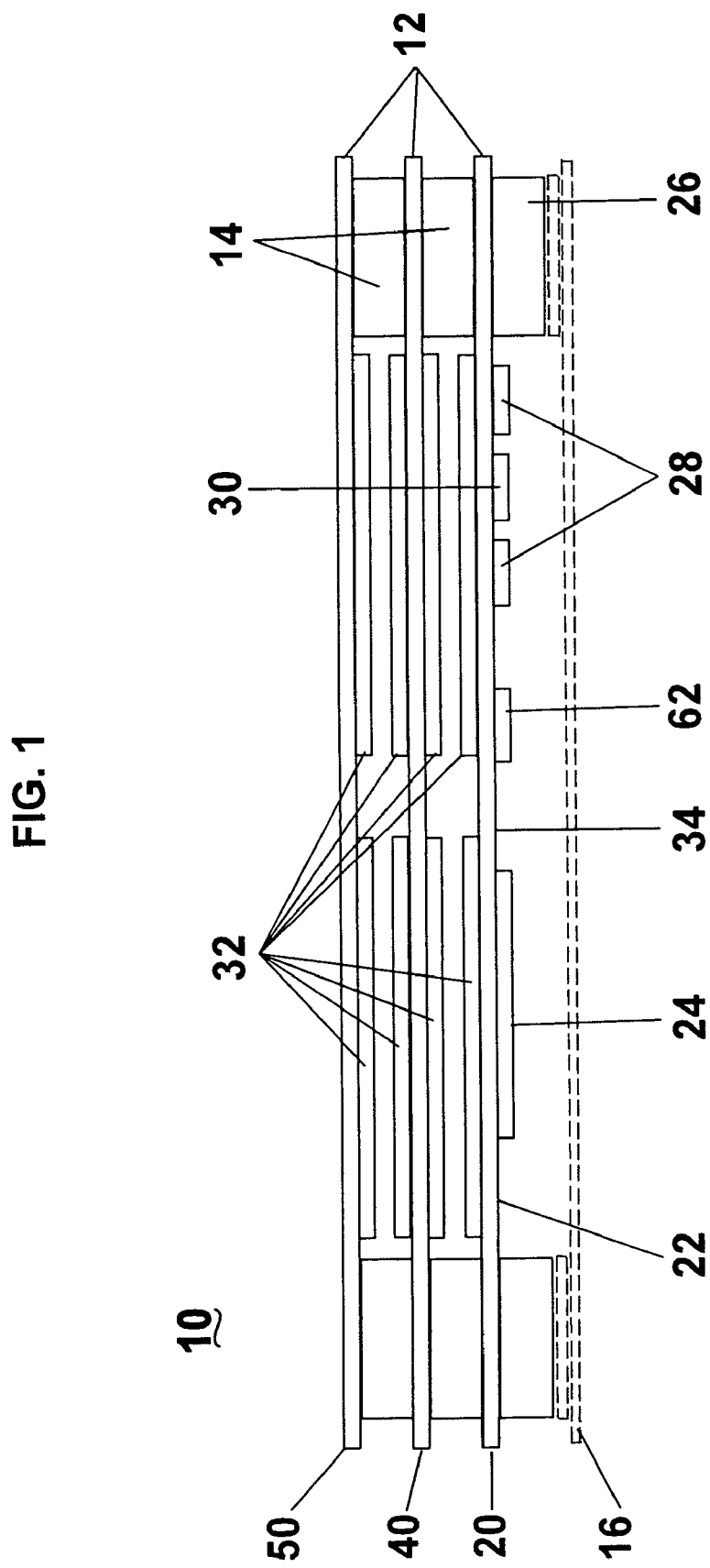
FIG. 1 illustrates a multi-board memory arrangement of a memory module according to an embodiment of the invention.
Figure 2:
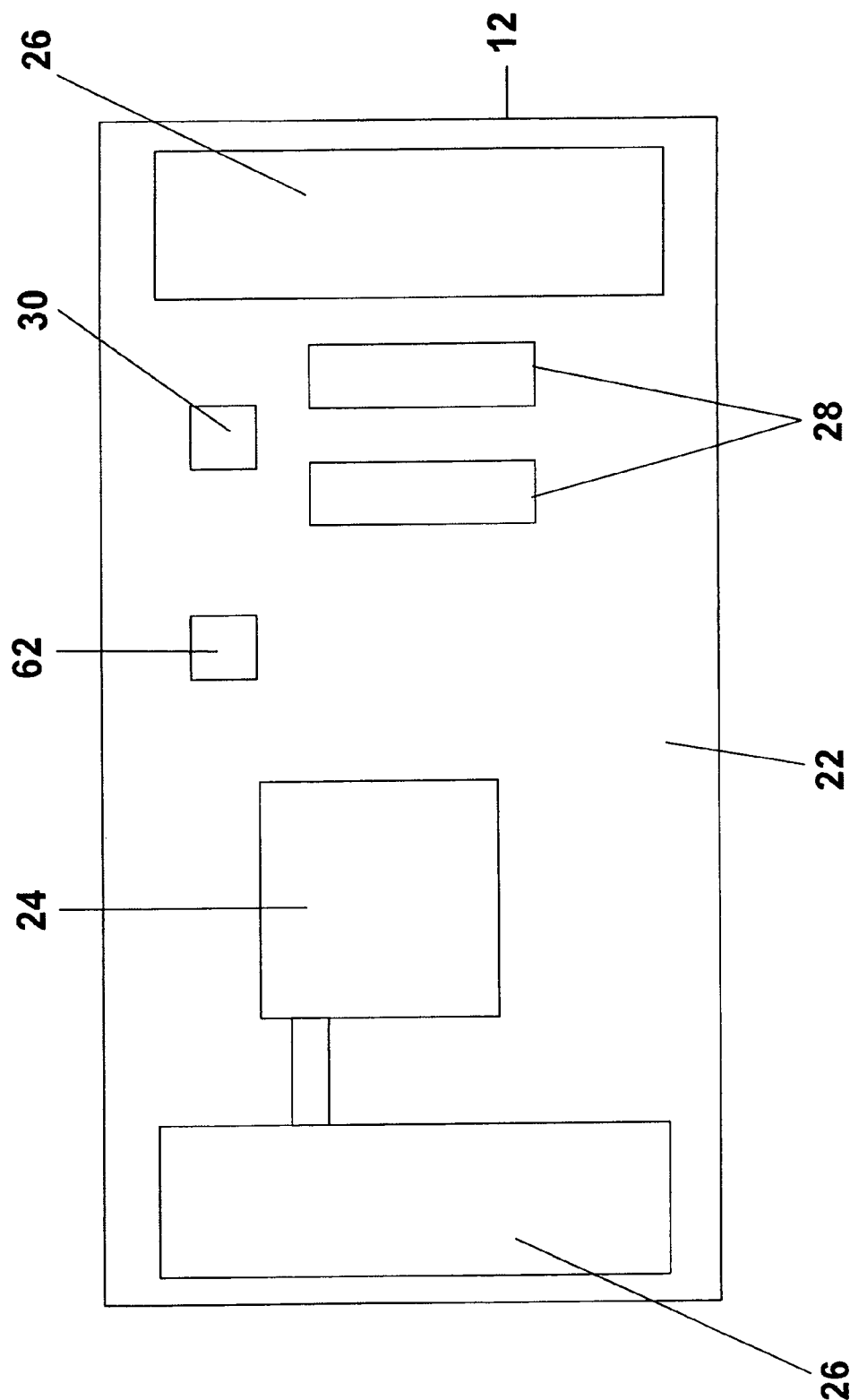
FIG. 2 illustrates a bottom view of a first memory board according to an embodiment of the invention.
Figure 3:
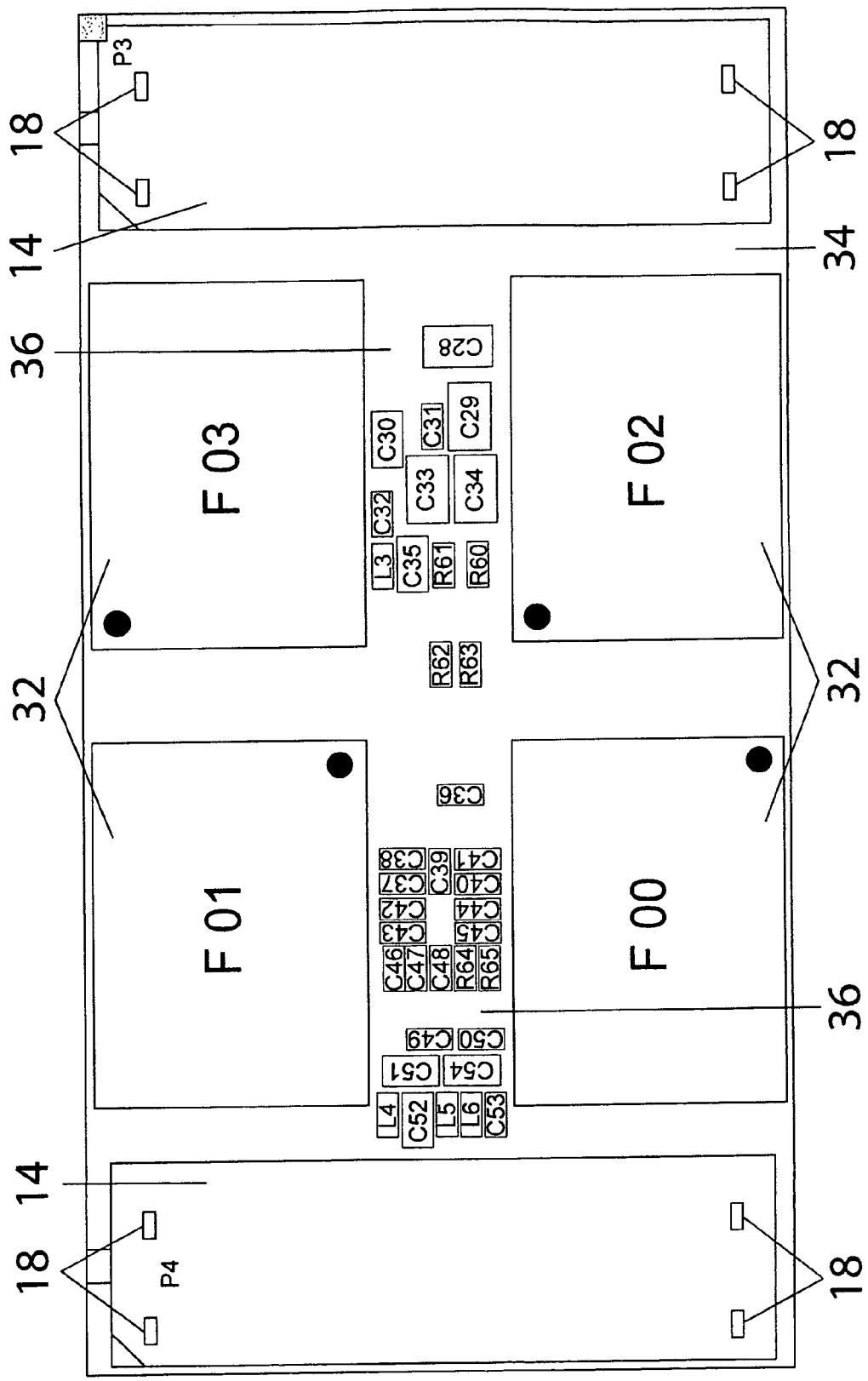
FIG. 3 illustrates a top view of a first memory board according to an embodiment of the invention.
Figure 4:
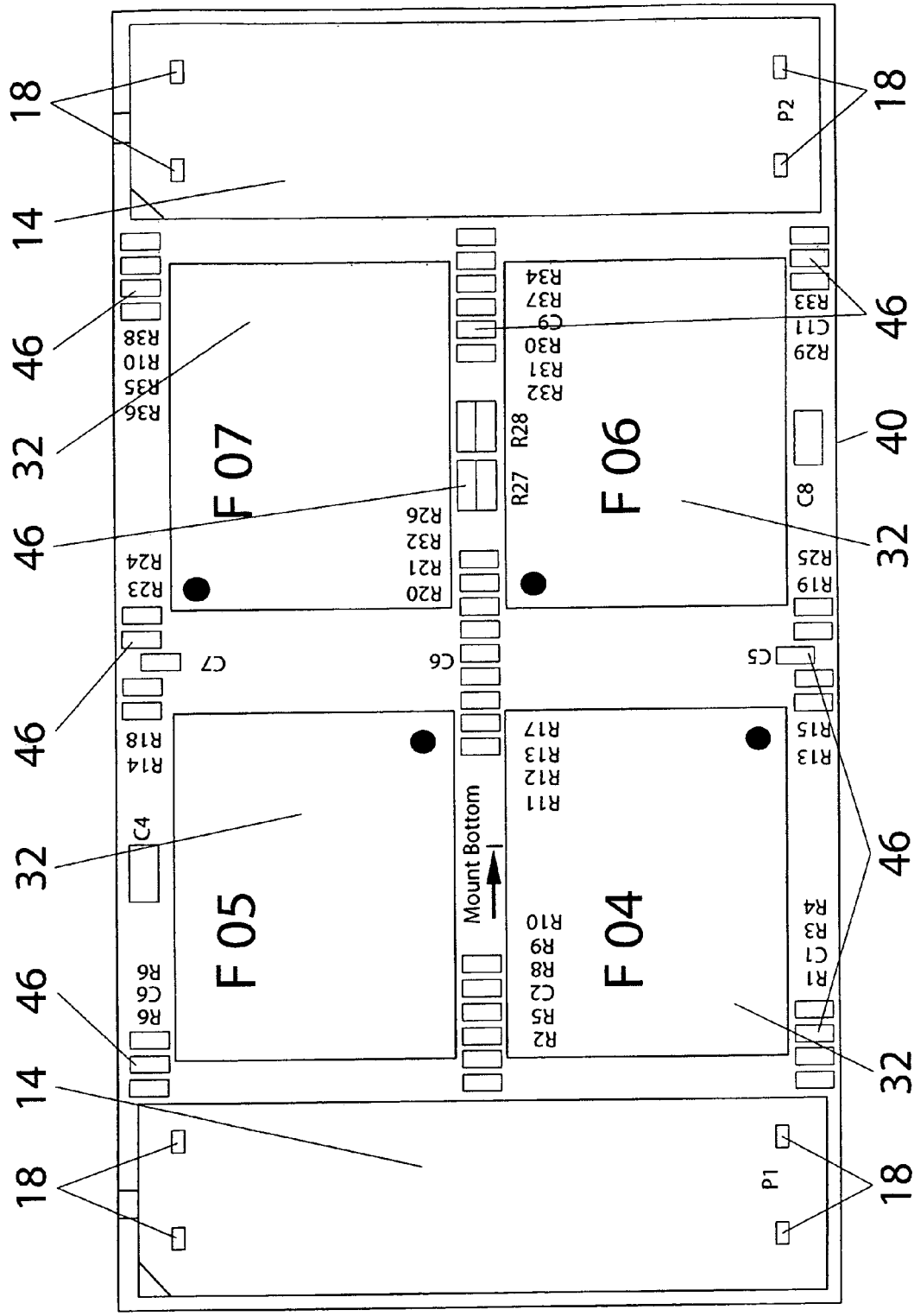
FIG. 4 illustrates a bottom view of a second memory board according to an embodiment of the invention.
Figure 5:
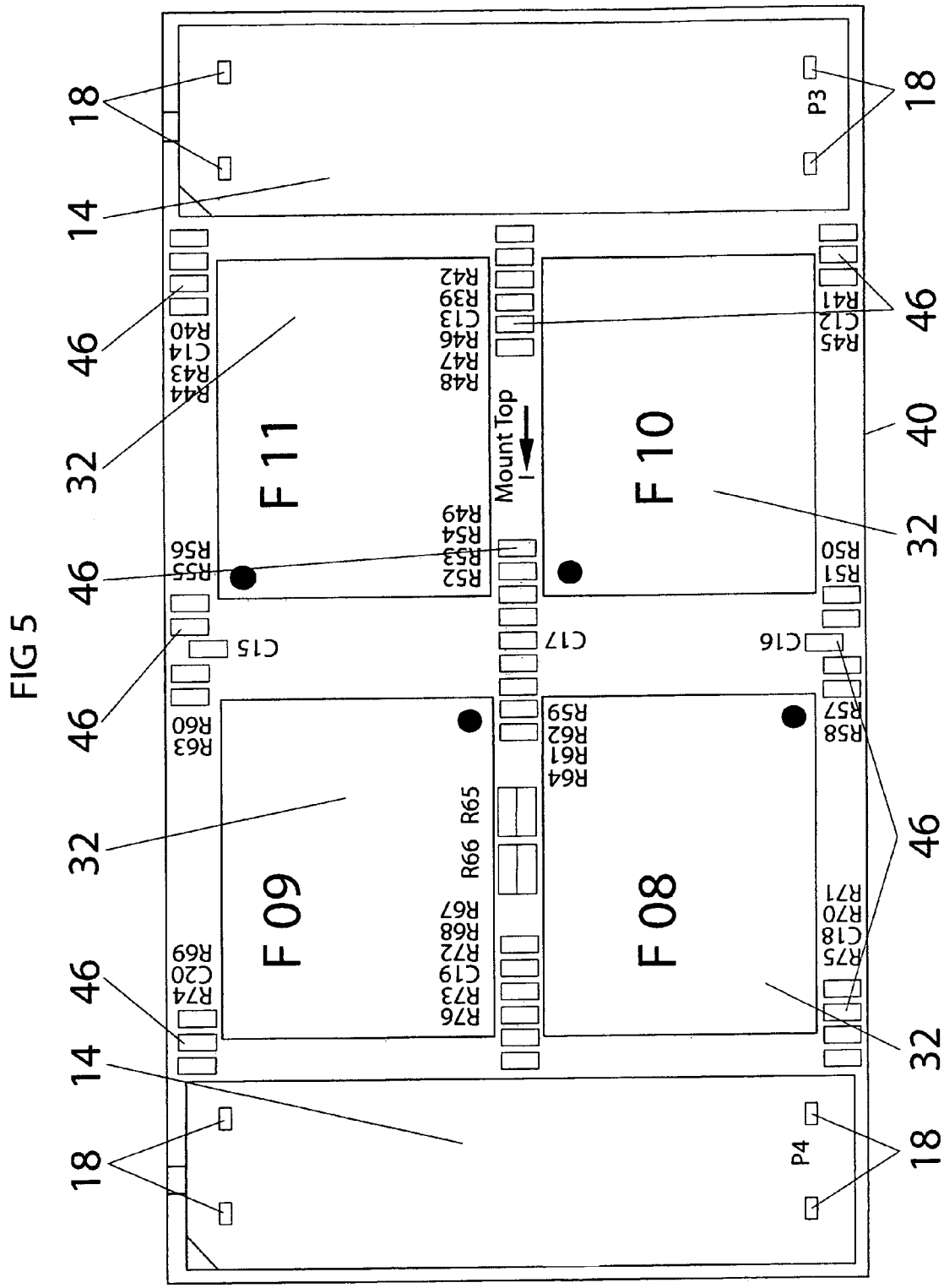
FIG. 5 illustrates a top view of a second memory board according to an embodiment of the invention.
Figure 6:
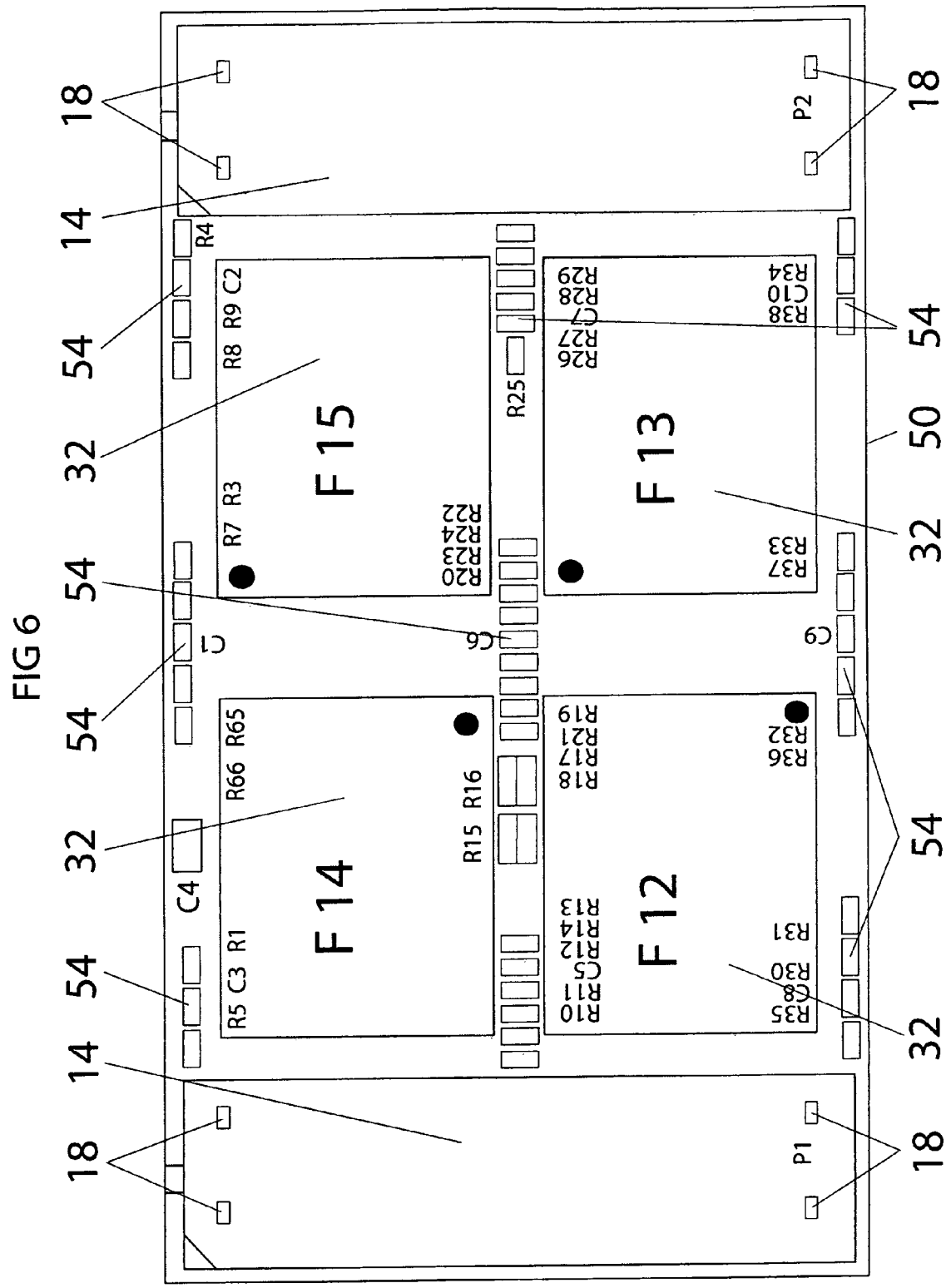
FIG. 6 illustrates a bottom view of a third memory board according to an embodiment of the invention.
Figure 7:
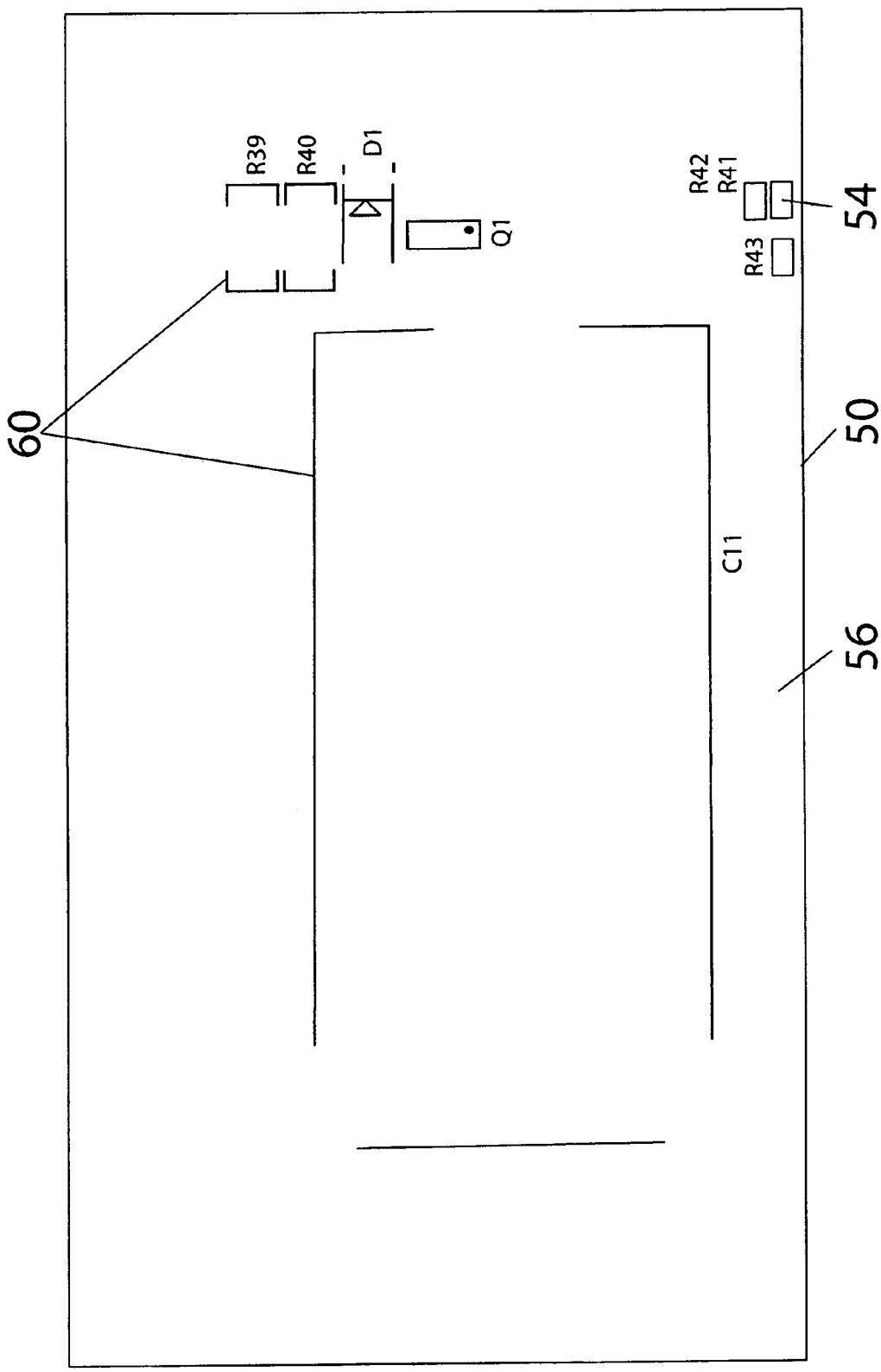
FIG. 7 illustrates a top view of a third memory board according to an embodiment of the invention.

Referring to FIGS. 1 through 9, a non-volatile memory module 10 may have multiple printed circuit boards 12 positioned, arranged or stacked vertically with spacer elements 14 positioned intermediate adjacent circuit boards 12 and intermediate a first circuit board 20 and a host or mother board 16, as best viewed in FIG. 1. While the designation vertical, top side, bottom side is used in this description to agree with the orientation of FIG. 1, it is understood that a memory module 10 may be connected to a mother board 16 in various orientations, for example, vertical, horizontal or inverted. Printed circuit boards (PCB) 12 are used in this description; however, it is understood that this is a substrate structure as understood in the art and that other substrate structures and materials may be used that may allow devices and components attachment and structural support of the module elements of a module without departing from the spirit and scope of the disclosure.

The first circuit board 20 may be positioned adjacent the mother board 16. A bottom surface 22 may have a NAND flash controller 24 attached in proximity to one of two mother board 16 PCB connectors 26. The positioning of the controller 24 close to one PCB connector 26 may allow relatively short differential pair, high speed wiring connection for I/O data signals from the mother board 16. Generally printed circuit boards are fabricated with printed wiring traces (not shown) imbedded in the substrate material in layers. The components, such as, the NAND flash controller 24 may be attached to the circuit boards 12 using surface mount technology with the circuit boards 12 having solder pad elements and the use of ball grid array (BGA) technology. Various devices may be thin, small-outline packages (TSSOP) to produce a compact memory module 10.

The positioning of the NAND flash controller 24 close to a PCB connector 26 may allow ease in design of a reliable module input/output for high speed data transmission and allow for longer connecting wiring on a mother board 16. The use of the NAND flash controller 24 positioned close to a PCB connector 26 and on the bottom surface 22 of the first circuit board 20 allows for optimizing the only relatively high speed, for example, 3 gigahertz data transmission for the memory module 10. This structure is a major benefit over existing memory module technology, for example, there is not a need for a high speed bus that is a serial bus, to be routed or transitioned through multiple layers of PCB's or substrate elements in the module to then be terminated with some form of control, impedance matching circuitry in the memory module in order to maintain a high quality signal.

The first circuit board 20 may also have support circuitry 28 and power supply control circuitry 30 attached to the bottom surface 22. The PCB connectors 26 may be pin and socket connectors to facilitate removal or replacement of a memory module 10 or may be surface mount attached to a mother board 16. The use of standard protocols, such as, SATA, IDE, SAS, and Fibre-channel, may allow ease of substituting a memory module 10 for an existing processor non-volatile memory storage device module that may have an installation form factor of 2.5 or 3.5 inches for a memory drive unit, for example, with use of a SATA to NAND controller. Different manufactures of non-volatile NAND flash memory controllers may group or channel data I/O transfer differently, for example, channel data in groups of 4 and 4 data lines or group 8 data lines for each NAND memory device. The use of selectable resistor values, for example, as identified in FIGS. 3 and 4 as R 27 and R 28, may allow for ease in configuring memory PCB for a selected NAND flash controller device 24. The PCB connectors 26 as well as the spacer elements 14 may be positioned adjacent opposed ends of each circuit board 12 and attached to solder pad grid arrays (not shown) that are connected to printed wiring traces using ball grid array surface mount technology. The spacer elements 14 may function as the connection link between circuit board 12 wiring and as structural support for the stacked printed circuit boards 12. Pads 18 may be installed in the spacer element 14 for positioning on the areas of the circuit boards 12 for surface mount chip component assembly processing to reduce susceptibility to over collapse of solder grid arrays and loss of structural integrity.

The NAND flash controller 24 controls parallels distribution of data for storage on eight data I/O connections for each NAND flash memory device 32 in the memory module 10. The speed of this data transmission is a relatively low speed signal of approximately 25 to 50 MHZ that may not require complicated impedance matching bus circuitry. The individual NAND flash memory devices 32 may be connected functionally for control, power and data transfer as may be understood in the art for such devices. However, to achieve a relatively dense, high speed, non-volatile flash memory storage device as compared to currently known flash memory devices, the memory module 10 with stacked PCB's 12 may be assembled using surface mount technology and an appropriate architecture of devices and components mounted on the PCB's 12.

As discussed above the first circuit board 20 bottom surface 22 may have the NAND flash memory controller 24 attached as well as other support circuitry 28 and power supply control 30. The upper surface 34 of the first circuit board 20 may have four NAND flash memory devices 32 attached with support components 36. The second circuit board 40 may have four NAND flash memory devices 32 mounted on a bottom surface 42 and an upper surface 44 with each surface 42, 44 also having support components 46. The third circuit board 50 may have four NAND flash memory devices 32 mounted on a bottom surface 52 with support components 54 attached. The upper surface 56 may have no electronic devices or components in the instance of the structure for an 512 gigabyte memory.

Alternatively, the upper surface 56 of the third circuit board 50 may have power supply backup components 60 and circuitry attached and connected as an alternate to such elements being positioned on the mother board 16 or external to the module 10. The components 60 may be super capacitors, battery technology or other suitable devices.

The memory module 10 may be enclosed, but allow air flow through the sides to allow cooling air supply to flow between PCB's 12 and the mother board 16. The spacer elements 14 may have a thickness depending on the height of devices and components on the PCB's to allow a 0.5 mm spacing between NAND flash memory devices 32. The positioning of the NAND flash controller device 24 close to a PCB connector 26 may facilitate the transmission of heat generated by the controller device 24 to be conducted away from this source through the PCB 12 to flow up the spacer elements 14 to other layers and down the PCB connector 26 to the mother board 16.

The memory module 10 may use offset pins in PCB connectors 26 for purposes of "hot-swapping" modules 10 to assure correct connection for power and signal connection. The memory module 10 may alternatively incorporate NOR gate technology 62 to prevent application of power to the module 10 prior to all pin surfaces seating for connector interface products. Connector pins located in opposed spaced apart PCB connectors 26 must sense a potential of either ground or power to open the NOR gate to allow power application.

During experimental prototype testing of a 128 GB memory device 10 with SATA 2.6 compatible interface the memory device 10 exhibited a sequential read transfer rate of 250 MB/second @ 128 K blocks, a sequential write transfer rate of 250 MB/second @ 128K blocks, and random read and write IOPS of 30,000 @ 4K blocks.

Fabrication of a memory module 10 may have a first PCB 20 assembly in a normal surface mount process in a panelized PCB for both upper surface and bottom surface. This surface mount process includes screen printing of solder paste, component placement including spacer elements, and reflow with the bottom surface processed and then the upper surface processed for PCB 20. The first PCB 20 is then separated from the panelized PCB and placed into a tray that is placed into the surface mount component placement machine as another element for placement onto the second PCB 40. The second PCB 40 upper surface 44 is assembled as described for the first PCB 20; however, when the bottom surface 42 is assembled for the second PCB 40 after screen printing and component placement the first PCB 20 is picked and placed onto the second PCB 40 in the wet paste. The assembly is then reflow processed. The second PCB panel is then separated into individual two layer assemblies and is then place in trays for surface mount compartment machine pick and place on the third PCB 50 to fabricate a three layer soldered memory module 10.

While the invention has been particularly shown and described with respect to the illustrated embodiments thereof, it will be understood by those skilled in the art that the foregoing and other changes in form and details may be made therein without departing from the spirit and scope of the invention.

I claim:

1. A device for non-volatile memory storage of electronic data comprising:
   a first substrate member having a first surface and a second surface;
   a first substrate connector and a second substrate connector spaced apart and attached to said first surface adjacent opposed ends of said first substrate member;
   a first spacer element and a second spacer element spaced apart and attached to said second surface adjacent opposed ends of said first substrate member;
   a NAND flash controller device attached to said first surface adjacent to one of said first and second substrate connector, and being operatively connected to said first and second substrate connector and to said first and second spacer element;
   a plurality of NAND flash memory devices disposed and attached to said second surface intermediate said first and second spacer element, and being operatively connected to said first and second spacer element and in communication with said NAND flash controller device;
   a second substrate member having a first surface and a second surface;
   a plurality of NAND flash memory devices disposed and attached to at least one of said first and second surface of said second substrate member; and
   said first surface of said second substrate member is attached to said first and second spacer element and said plurality of NAND flash memory devices of said second substrate member operatively connected to said NAND flash controller device.

2. The device as in claim 1 wherein said second substrate member on said second surface has a plurality of NAND flash memory devices disposed and attached, and being operatively connected to said NAND flash controller device.

3. The device as in claim 1 wherein:
   said second surface of said second substrate member has a third and fourth spacer element spaced apart and attached thereto;
   a third substrate member having a first surface and a second surface has a plurality of NAND flash memory devices disposed and attached to said first surface; and
   said first surface of said third substrate member is attached to said third and fourth spacer element and said plurality of NAND flash memory devices of said third substrate member are operatively connected to said NAND flash controller device.

4. The device as in claim 3 wherein:
   said second surface of said third substrate member has a fifth and sixth spacer element spaced apart and attached thereto;
   at least one additional substrate member having a first surface and a second surface has a plurality of NAND flash memory devices disposed and attached on at least one of said first and second surfaces;
   said at least one additional substrate member has said first surface attached to said fifth and sixth spacer element and said plurality of NAND flash memory devices of said at least one additional substrate member operatively connected to said NAND flash controller device.

5. The device as in claim 1 wherein said NAND flash controller device controls a plurality of parallel data transmission busses connected to each of said plurality of NAND flash memory devices disposed on each of said first and second substrate members.

6. The device as in claim 3 wherein said NAND flash controller device controls a plurality of parallel data transmission busses connected to each of said plurality of NAND flash memory devices disposed on each of said first, second and third substrate members.

7. The device as in claim 1 wherein said first surface of said first substrate member has a memory module support circuitry and a power supply control circuitry mounted thereon in communication with said first and second substrate members.

8. The device as in claim 1 wherein said second substrate member on said second surface has a power supply backup component disposed and attached that is operatively connected to each of said first and second substrate members.

9. The device as in claim 1 wherein said first substrate member and said second substrate member further comprising a plurality of support components attached and operatively connected on each of said first and second surface.

10. The device as in claim 3 wherein said third substrate member further comprising a plurality of support components attached and operatively connected on each of said first and second sides.

11. The device as in claim 3 wherein said third substrate member on said second surface has a power supply backup component disposed and attached that is operatively connected to each of said first, second and third substrate members.

12. The device as in claim 1 wherein said attachments are surface mount solder process attachments.

13. The device as in claim 3 wherein said attachments are surface mount solder process attachments.

14. The device as in claim 1 wherein said NAND flash controller device is a SATA to NAND conversion flash controller device.

15. The device as in claim 1 wherein NOR gate circuitry is incorporated in said first substrate member and operatively connected to monitor said first and second spaced apart substrate connector for connection to an external source.

16. A method for manufacture of a non-volatile memory storage device for electronic data comprising:
   fabricating a first PCB substrate member having a first and second surface;
   screen printing of solder paste on said first and second surface;
   picking and placing a NAND flash controller device and a first and second spaced apart substrate connector on said first surface;
   picking and placing a plurality of NAND flash memory devices and a first and second spaced apart spacer element on said second surface;
   reflowing said first PCB substrate member having a first and second surface;
   fabricating a second PCB substrate member having a first and second surface;
   screen printing solder paste on said second surface of said second PCB substrate member and picking and placing a plurality of NAND flash memory devices thereon;
   reflowing said second PCB substrate member in said surface mount solder apparatus;

screen printing solder paste on said first surface of said second PCB substrate member;

picking and placing a plurality of NAND flash memory devices on said first surface of said second PCB substrate member;

picking and placing said first PCB substrate member on said second PCB substrate member with said first and second spaced apart spacer elements disposed on said first surface of said second PCB substrate member; and reflowing said first and second PCB substrate member assembly in said surface mount solder apparatus.

* * * * *